United States Patent [19]

Roy

[11] Patent Number: 4,695,792

[45] Date of Patent: Sep. 22, 1987

[54] METHOD AND SYSTEM FOR MEASURING THE AMPLITUDE AND PHASE ANGLE OF HARMONICS IN A PERIODIC SIGNAL

[75] Inventor: Gilles Roy, Beloeil, Canada

[73] Assignee: Ecole Polytechnique, Montreal, Canada

[21] Appl. No.: 809,046

[22] Filed: Dec. 16, 1985

[51] Int. Cl.$^4$ .............................................. G01R 25/00
[52] U.S. Cl. ................................ 324/83 D; 324/77 B; 324/78 D; 455/340; 328/109
[58] Field of Search ................. 324/77 R, 77 B, 78 R, 324/78 D, 83 D; 328/109, 115, 151, 167; 333/173; 455/226, 266, 340

[56] References Cited

U.S. PATENT DOCUMENTS

| | | | |
|---|---|---|---|
| 3,895,294 | 7/1975 | Vinding | 324/83 D |
| 3,990,004 | 11/1976 | Newton | 324/57 SS |
| 4,316,108 | 2/1982 | Rogers, Jr. | 455/340 |
| 4,512,194 | 4/1985 | Beuter | 73/579 |

*Primary Examiner*—Stewart J. Levy
*Assistant Examiner*—Kevin D. O'Shea
*Attorney, Agent, or Firm*—Burns, Doane, Swecker & Mathis

[57] ABSTRACT

A method and system for simultaneously detecting the amplitude and phase angle of harmonics in a periodic signal. A tunable tracking filter is connected to an input of the system to receive a periodic signal having a frequency within a predictable range. A conditioning circuit is connected to the input to tune the tracking filter to a selected harmonic in the periodic signal. A programmable frequency multiplier forms part of the conditioning circuit and is connected for locking the clock frequency of the filter to tune it to the selected harmonic of the periodic signal to provide at its output an output signal having the amplitude and corresponding phase of the selected harmonic.

16 Claims, 17 Drawing Figures

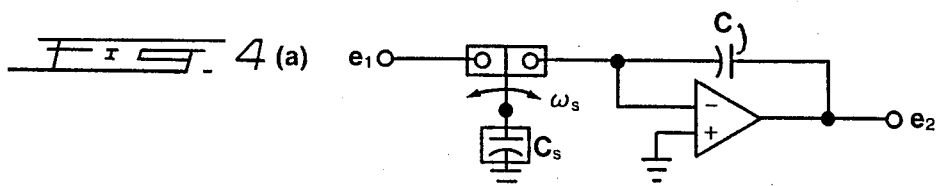
FIG. 4(a)
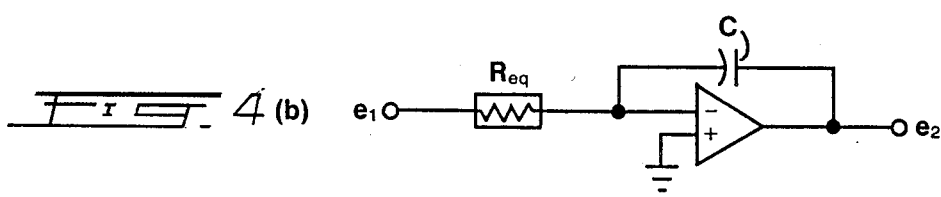
FIG. 4(b)
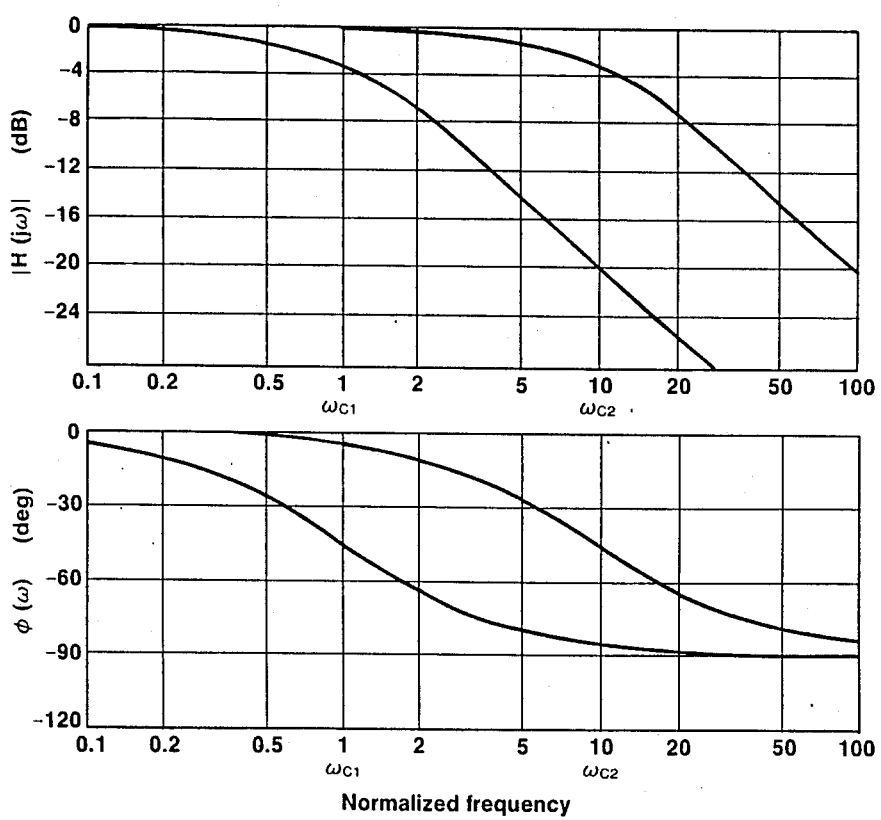
FIG. 5(a)
FIG. 5(b)

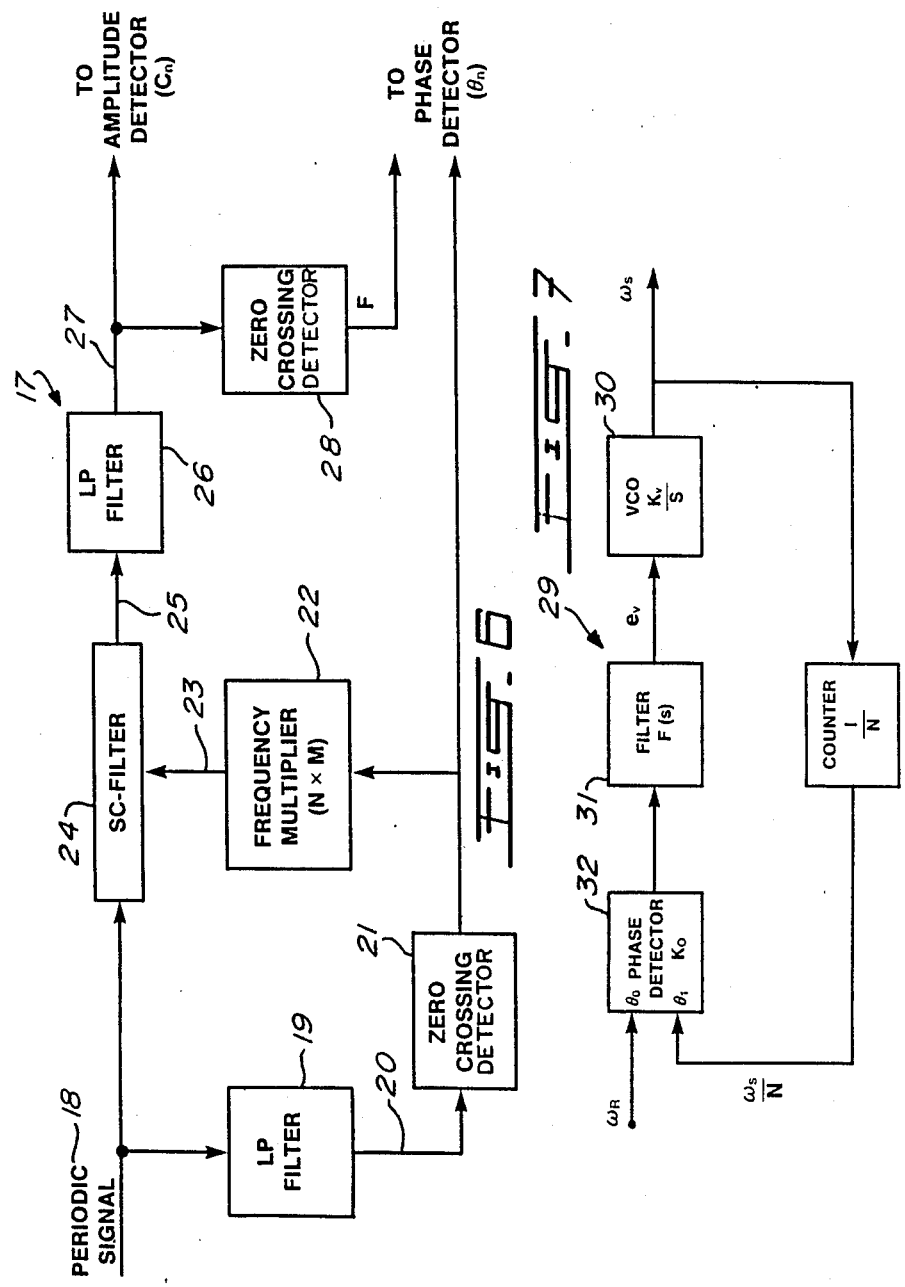

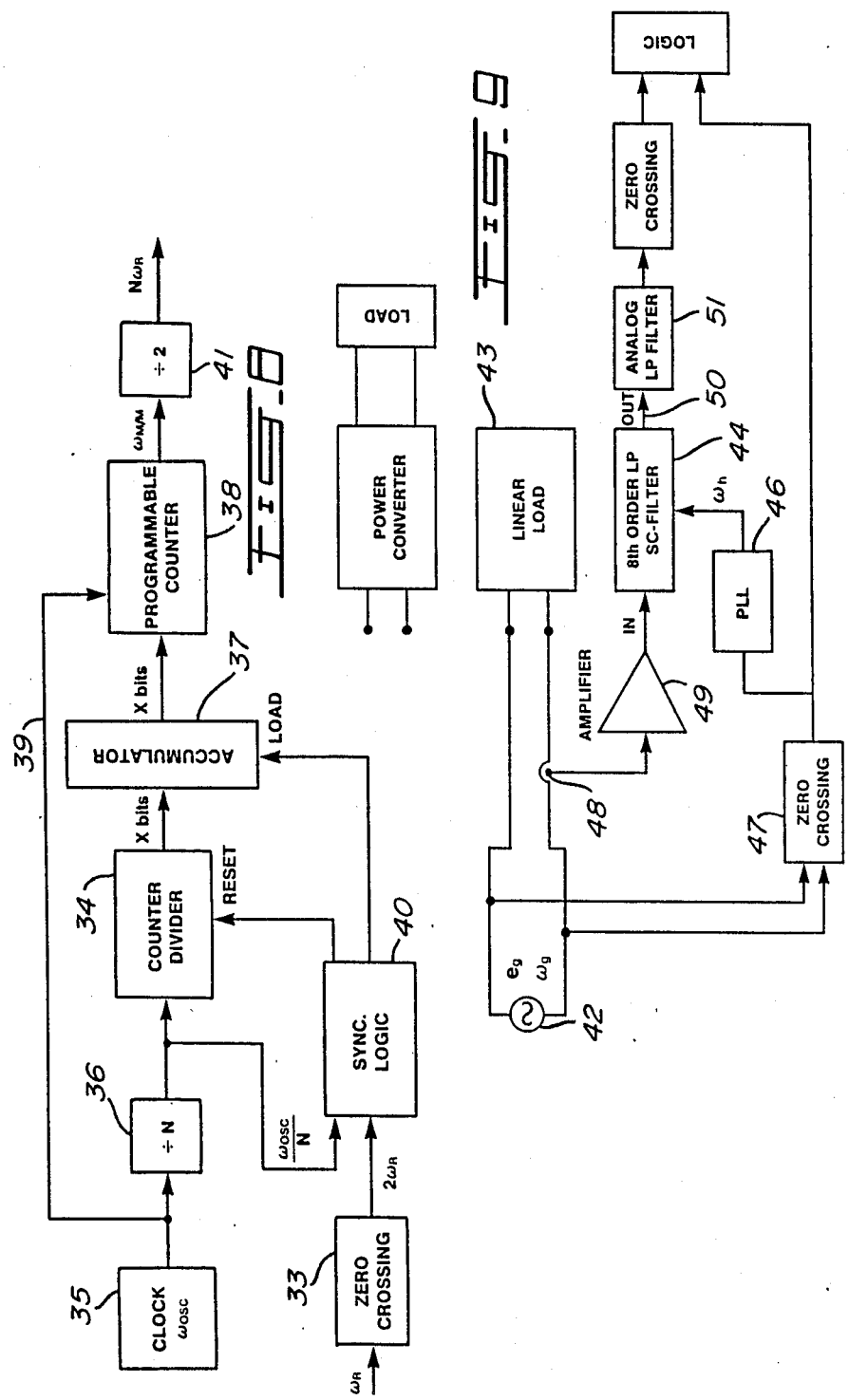

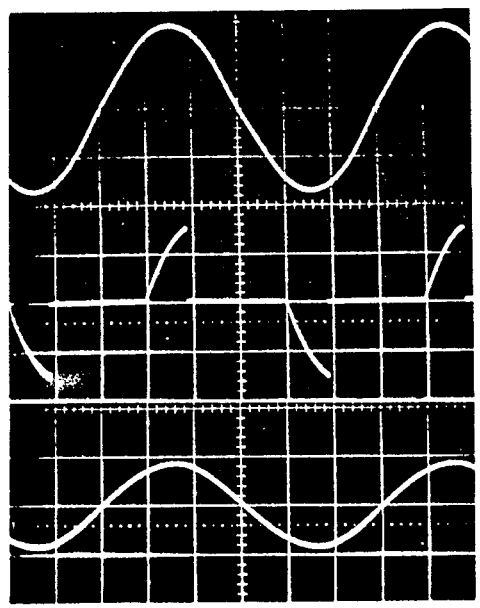
100V/div
0.5A/div
α = 55°
β = 109°
φ = 30°
0.25A/div
FIG. 14A  60°/div
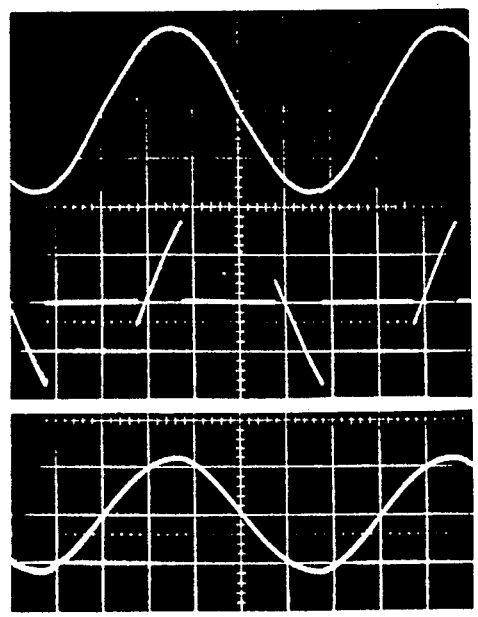
100V/div
1,0A/div
α = 43°
β = 103°
φ = 60°
0.25A/div
FIG. 14B  60°/div

METHOD AND SYSTEM FOR MEASURING THE AMPLITUDE AND PHASE ANGLE OF HARMONICS IN A PERIODIC SIGNAL

BACKGROUND OF INVENTION (a) Field of the Invention

The present invention relates to a method and a system for measuring the amplitude and phase angle of harmonics in a periodic signal by utilizing a tunable tracking filter which is connected to receive the periodic signal having a frequency within a predictable range. The tunable tracking filter may be a switch capacitor filter or an analog-type filter.

(b) Description of Prior Art

As far back as the 1920's, power system harmonics were an important matter under investigation by power utilities and telephone companies. Early problems were mainly related to low-order current harmonics generated by transformers and induction motors. The most successful effort to reduce these harmonics utilized the transformer connections. For example, delta transformer connections act as a blocking filter for the 3rd, 6th, 9th, etc. harmonics. Today, the proliferation of non-linear loads, created mostly by static power converters, has increased the level of power harmonics and represents a growing source of problems afflicting other customer loads and the power network itself.

The sources of harmonics are multiple: transformers, induction motors, arc furnaces and static power converters for electrochemical processes, dc and ac drives, HVDC transmission and var control. Most of these sources act as non-linear loads affecting primarily the current waveform. Some common cases of distortion are as follows:

(a) rectangular shapes due to the rectifying process;

(b) stair-step shapes generated in the synthesis of sinusoidal waveform;

(c) high frequency pulses caused by direct ac to ac conversion involving constant switching from one phase to another.

Even in the presence of pure sine wave voltages, the effect of current harmonics produced by a specific load will affect the distribution system. Considering the power system example of FIG. 1, one can see that the distorted currents, flowing through the characteristic impedance of the transmission line, will generate voltage harmonics. The other customer loads connected to the same network will suffer from this electrical pollution.

The evaluation of the effects of harmonics on power systems is a complex task. Some valuable assessments are given in an article of the I.E.E.E., Working Group on Power System Harmonics, 84 EH0221-2PWR, New York, 1984, which also list many interesting studies on the subject. Moreover, utilities are very concerned about the growing level of system harmonics and about the application of measures to temper this phenomenon. Many measurement techniques have been suggested in the prior art literature.

Phase angle and amplitude measurement of harmonics can be classified according to two procedures. The first method performs selective null detection in conjunction with a wave analyzer. The second method is based on Fourier series (orthogonality). Both procedures yield acceptable results if the instruments used are properly designed and calibrated. However, their implementation on a large scale could suffer from drawbacks like the high overall cost, the sensitivity of critical components and the time needed to process the information.

Many methods are known for measuring electrical parameters such as active power and apparent voltamperes. The most common are: electrodynamometers, thermoinstruments, electronic multipliers, Hall effect transducers, fast Fourier transform systems, dedicated distortion analyzers, and frequency selective voltmeters. However, most of these methods fail to provide an easy measurement of the displacement power factor. For example, in single phase, single frequency, the measurement can only be performed by using a high-Q tuned filter or with the help of elaborate methods. Both analog and digital techniques currently used to extract the fundamental component of an electrical signal are plagued with severe shortcomings. The analog techniques involve serious delays due to the low-pass filters required while digital ones suffer due to the considerable computing time required by FFT techniques. Therefore, these methods are ill-suited to measure the power displacement factor of variable frequency power conditions, where both current and voltage may be heavily distorted, and where the frequency may well vary between 1 Hz and 200 Hz.

SUMMARY OF THE INVENTION

It is a feature of the present invention to provide a system and method capable of detecting, simultaneously, the amplitude and phase of any given harmonic and to maintain the amplitude and phase despite variations in the incoming periodic signal. Known tracking filters are unable to perform such a detection in the presence of a variable frequency signal (periodic signal).

It is a feature of the present invention to provide a novel harmonics detection and measuring system for measuring the amplitude and phase angle of harmonics in a periodic signal by utilizing a tunable tracking filter connected to the periodic signal which has a frequency within a predictable range.

Another feature of the present invention is to provide a method of detecting and measuring the amplitude and phase angle of harmonics in a periodic signal by utilizing a tunable tracking filter which is connected to the periodic signal which has a frequency within a predictable range.

Another feature of the present invention is to provide a new technique for detecting and measuring the amplitude as well as the phase angle of harmonics, using a tracking filter. The measurement is performed by a selective filtering of each harmonic, using programmable switched-capacitor-filters, constantly tuned by a synchronized clock derived from the fundamental component of the line voltage.

According to a broad aspect of the present invention, there is provided a harmonics analyzer system for simultaneously detecting the amplitude and phase angle of harmonics in a periodic signal. The system comprises a tunable tracking filter connected to an input of the system for receiving the periodic signal having a frequency within a predictable range. Conditioning circuit means are connected to the input to tune the tracking filter to a selected harmonic in the periodic signal. A programmable frequency multiplier circuit receives the pulses and connects to the tracking filter for locking the clock frequency thereof. This tunes the tracking filter to the selected harmonic of the periodic signal to provide at its output an output signal having the amplitude and corresponding phase of the selected harmonic.

According to a still further broad aspect of the present invention, there is provided a method for detecting the amplitude and phase angle of harmonics in a periodic signal which comprises selectively filtering a harmonic using a tunable tracking filter which is locked on a selected harmonic by means of a frequency multiplier which is synchronized by the fundamental frequency of the periodic signal.

BRIEF DESCRIPTION OF DRAWINGS

A preferred embodiment of the present invention will now be described with reference to the examples thereof as illustrated in the accompanying drawings, in which:

FIGS. 4A and 4B are simplified schematic diagrams illustrating a basic inverting integrator with switch-capacitor and with an effective resistance;

FIGS. 5A and 5B are characteristic curves illustrating the first order low-pass filter tuned at two different cut-off frequencies illustrating the magnitude of the signals and the phase shift of the signals;

FIG. 6 is a block diagram of the harmonics detection and measuring system of the present invention;

FIG. 7 is a block diagram showing a phaselock loop frequency multiplier;

FIG. 8 is a block diagram of a synchronized digital frequency multiplier;

FIG. 9 is a block diagram of an experimental test set-up;

FIGS. 14A and 14B are photographs illustrating the waveforms of the supply voltage, supply current and supply fundamental current of actual tests.

DESCRIPTION OF PREFERRED EMBODIMENTS

Figure 1:
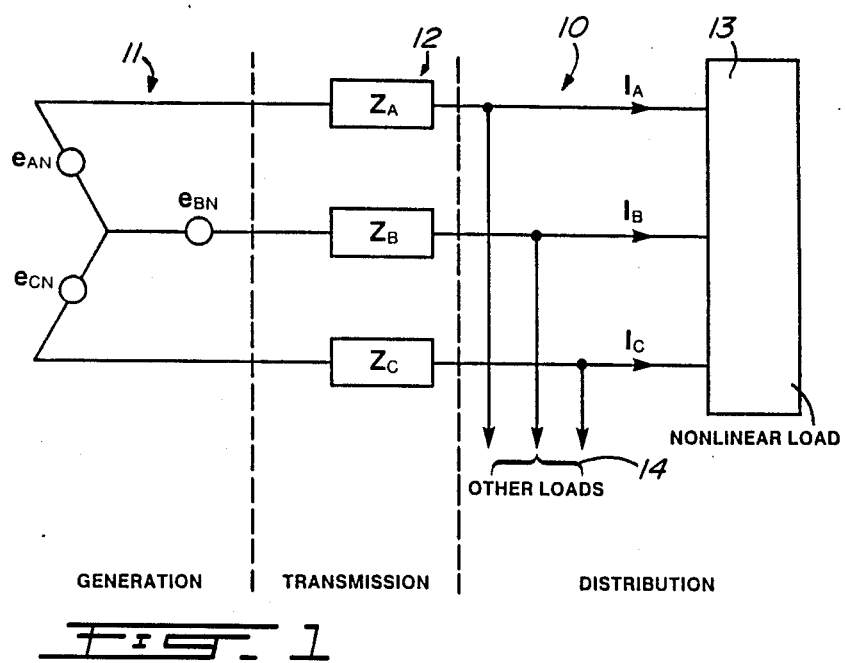
FIG. 1 is a simplified view illustrating a power system with a non-linear load.

FIG. 1 gives a simplified view of a power system 10 comprising three main parts: part 11 represents the power source, producing an almost purely sinusoidal voltage (the internal impedance of the generator is voluntarily omitted); part 12 depicts the characteristic impedance of the transmission line and part 13 shows a non-linear load connected to the system along with other non-identified loads 14. For the sake of simplicity, all loads are assumed to be connected to a single point in the system. Even with a pure generated sine wave, the line voltages appearing at the terminals of the non-linear load can be quite distorted due to the non-sinusoidal currents flowing through the line impedances. Both the relative importance of the load and the distortion level of current waveforms can affect line voltages at this point. For other loads connected to this distribution system, line voltages will appear distorted. In such a case, when both current and voltage are distorted, the performance analysis of a specific load or part of an ac network becomes complex.

Figure 2:
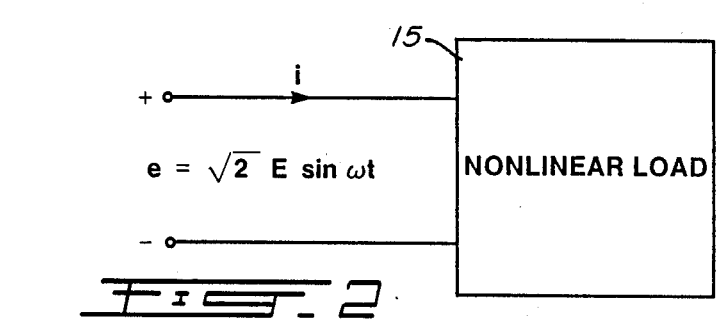
FIG. 2 is a simplified block diagram illustrating the non-linear load supplied by sinusoidal voltage.

The operation of most power converters can be represented as illustrated in FIG. 2, by a non-linear time-varying load 15. Assuming an ideal (undistorted) voltage supply e, such a load 15 can draw line currents which consist of fundamental and harmonic components. Instantaneous supply voltage and current can be expressed as $$e = \sqrt{2} \, E \sin \omega t \tag{1}$$

$$i = \sqrt{2} \sum_1^n I_n \sin(n\omega t + \theta_n) \tag{2}$$

This expression (2) assumes that the line current does not contain a dc component. Electrical evaluation and comparison of non-linear loads can be performed using certain parameters such as distortion and displacement factors. The simple power system of FIG. 2 can be described by the following expressions, (a) Active Power (P)

$$P_1 = \frac{1}{2\pi} \int_0^{2\pi} e \, i \, d(\omega t) = E \, I_1 \cos \theta_1 \tag{3}$$

(b) Reactive Voltamperes (Q)
$$Q_1 = E I_1 \sin \theta_1 \tag{4}$$
(c) Displacement Power Factor ($\lambda_1$)
$$\lambda_1 = \cos \theta_1 \tag{5}$$
(d) Distortion Power Factor ($\lambda_\delta$)

$$\lambda_\delta = \frac{I_1}{I} \tag{6}$$

(e) Power Factor ($\lambda$)

$$\lambda = \frac{P}{S} = \frac{I_1}{I} \cos \theta_1 = \lambda_\delta \lambda_{\theta_1} \tag{7}$$

(f) Apparent Voltamperes (S)

$$S = EI = E \left[ \sum_1^n I_n^2 \right]^{\frac{1}{2}} \tag{8}$$

(g) Distortion Voltamperes (D)
$$D^2 = S^2 - (P_1^2 + Q_1^2) \tag{9a}$$

$$D^2 = E^2 (I^2 - I_1^2) = E^2 \left[ \sum_2^n I_n^2 \right] \tag{9b}$$

It should be noted that the numeral one subscript for P and Q means that only the fundamental components of voltage and current produce active power and reactive voltamperes in a non-linear load supplied by sinusoidal voltage. The power factor is made up of two components: displacement ($\lambda_{\theta_1}$) and distortion ($\lambda_\delta$). The displacement component is related to the displacement of the fundamental component of the current; the distortion component is associated with harmonics in the current. Unity represents the best achievable value for each term.

A non-linear load, such as a power converter, acts as a harmonic current generator. FIG. 2 illustrates such a non-linear load supplied by a sinusoidal voltage. Because of the finite impedance of the transmission line, including transformers, current harmonics, circulating in the power system of FIG. 1, generate harmonic voltage components. These components exist at the same frequencies as those of the current harmonics. The electrical evaluation of a linear load, connected in parallel with such a system, can be performed following a procedure similar to the one used in the previous case.

Figure 3:
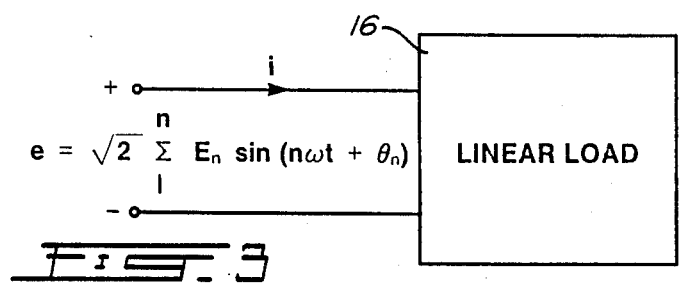
FIG. 3 is a simplified block diagram illustrating a linear load supplied by sinusoidal voltage.

Considering the simplified system of FIG. 3, supply voltage and load current can be expressed as $$e = \sqrt{2} \sum_{1}^{n} E_n \sin(n\omega t + \phi_n) \quad (10)$$

$$i = \sqrt{2} \sum_{1}^{n} I_n \sin(n\omega t + \phi_n + \theta_n) \quad (11)$$

where $\theta_n$ represents the phase angle for the sinusoidal excitation of the nth harmonic frequency. Based on a similar analysis presented in equation (8), active power, reactive and apparent voltamperes, and distortion voltamperes resulting from the operation of FIG. 3 system are $$P = \sum_{1}^{n} E_n I_n \cos \theta_n \quad (12)$$

$$Q = \sum_{1}^{n} E_n I_n \sin \theta_n \quad (13)$$

$$S = EI = E \left[ \sum_{1}^{n} E_n^2 \sum_{1}^{n} I_n^2 \right]^{\frac{1}{2}} \quad (14)$$

$$D^2 = \sum_{1}^{n} E_n^2 \sum_{1}^{n} I_n^2 - \sum_{1}^{n} E_n^2 I_n^2 \quad (15)$$

In a typical power network, FIG. 1, power is shared between linear and non-linear loads. A full analysis of the electrical parameters at each major load becomes complex if one must account for the harmonics present in the network. The harmonic measurement technique proposed provides a valuable tool for the evaluation of the performance of each load as well as the overall system.

The availability of programmable switched-capacitor filters make it possible to design filters which maintain an almost constant phase shift despite wide variations in the frequency of the input signal.

Most of the time, realizing a sharp variable filter with passive components requires costly hybrid devices. On the other hand, digital filters need analog to digital conversion and complex clock requirements, and therefore, also generate expensive solutions. Switched-capacitor techniques make it possible to design high order filters with an absolute control of the cutoff frequency.

The basic operation of the switched-capacitor simulates a variable resistor being adjusted by means of a clock frequency. FIGS. 4A and 4B present an integrator using this technique. With simple circuit analysis, it can be shown that the switched-capacitor simulates a resistor of value $$R_{eq} = \frac{1}{C_s \omega_s} \quad (16)$$

The transfer function of this integrator becomes $$H_{sc}(j\omega) = \frac{-1}{j\omega \frac{M}{\omega_s}} \quad (17)$$

where $M = C/C_s$ is a design constant. This relation means that the time constant can be tuned via the clock frequency $\omega_s$. Also, the stability of the function is very good because the integrator time constant relies on the ratio of two capacitors physically located in the same silicon chip. Such an integrator serves as the building block for realizing very predictable state-variable filters. For example, the transfer function of a first order low-pass filter is expressed as:

$$H_{lp}(j\omega) = \frac{1}{j\omega \frac{M}{\omega_s} + 1} = \frac{1}{j\omega/\omega_s + 1} \quad (18)$$

It becomes obvious that the cutoff frequency of this filter, $\omega_c = \omega_s/M$, is directly dependent on the clock frequency. Furthermore, because of the good approximation with a linear filter, when using a high enough value for the $\omega_c/\omega_s$ ratio, it is possible to control the amplitude as well as the phase characteristics of the filter.

FIGS. 5A and 5B illustrate the characteristics of a first order low-pass filter tuned at two different cutoff frequencies. Without altering the topology of the filter or changing any value of the external passive components, it is possible to move the corner frequency of the filter to a specific value, just by adjusting the filter clock frequency. Moreover, phase shift will be precisely altered in the same way as the amplitude. The stability and the accuracy of the filter characteristics at any new adjusted cutoff frequency depend solely on the accuracy and stability of the clock frequency.

This simple method of tuning a switched-capacitor filter (SCF) opens the way to the design of devices for harmonic measurements in power electronics and other fields. By locking the filter clock frequency, through a frequency multiplier, to the fundamental frequency of a periodic signal, it is possible to tune the SCF exactly on the fundamental component or on any harmonic component of this signal.

Referring now to FIG. 6, there is shown a simplified block diagram of the measurement system 17 of the present invention. Basically, the system works as follows: A periodic signal 18 of unknown frequency, but within a predictable range, passes through a sharp low-pass filter 19 to remove medium and high order harmonics. The output 20 of the filter 19 enters a zero crossing detector 21 which produces pulses at the fundamental frequency of the periodic signal. These pulses serve to synchronize a programmable frequency multiplier 22 with a N×M ratio, where N stands for the harmonic order. The output signal at output 23 forms a pulse train of N×M times the fundamental frequency of the input signal. The signal at output 23 becomes the input clock of a high order band-pass switched-capacitor filter 24 which has a selected clock-to-center frequency ratio of M. This means that the center frequency of the filter 24 is tuned to N times the fundamental frequency of the input signal 18. The SCF 24 output signal on output 25 resembles a synthesized sinusoid made of a hundred discrete levels, resulting from the commutation action inside the SCF 24. A conventional analog low-pass filter 26 is then used to clean the signal of any clock residues. Analog measurement of the desired output signal 27 will yield the amplitude of the Nth harmonic, or $C_n$. Phase measurement is accomplished by digitally comparing the zero-crossing mark of the signal 27 with the reference mark produced by the fundamental component of the input signal 18 in a detector 28.

In order to maintain an accurate measurement of both the amplitude and the phase of any selected harmonic, the clock frequency of the SCF 24 must be precisely adjusted to N×M times the fundamental frequency of the incoming signal 18. Furthermore, frequency drift in this signal can be expected, particularly when the measurement is performed on a small network or an unsynchronized source like a UPS or a windmill generator. For both these reasons, a precise frequency multiplier is needed. Two possible solutions are disclosed and namely the phase-locked loop (PLL) and the digital frequency multiplier.

The phase-locked loop (PLL) is a well-known analog method used to perform a frequency multiplication. FIG. 7 shows the basic block diagram of a PLL 29.

In the locked condition, the output frequency $\omega_s$ becomes $$\omega_s = N \omega_R \quad (19)$$

By properly designing the low-pass filter 31 and by choosing the right value for the gain constant, Kv, of the voltage controlled oscillator (VCO) 30, a considerable locking range can be obtained. However, transients on the reference signal, $\omega_R$, can be such that an unlocked condition may exist for some time during which the VCO output frequency, $\omega_s$, is unstable. This condition may be minimized by selecting appropriate characteristics for the phase detector 32. It is recommended to use a voltage pump phase frequency detector 32 resulting in a positive action of the circuit during the unlocked condition of the PLL 29.

Despite the best PLL design, an unlocked condition during transient typically lasts for three or more periods of the reference frequency. A shorter lock time can be achieved by using a digital method of frequency multiplication. Such a device was introduced many years ago. An improved version is illustrated in FIG. 8. For each half period of the reference signal, a short pulse is generated by a zero-crossing detector 33. This pulse synchronously resets a free-running counter 34 clocked by a high frequency clock 35 divided by a prescaler ($\div$N) 36. At the end of each half reference period, the content of the counter 34 is moved to an accumulator 37 which sets up the input bits of a programmable counter 38. The programmable counter 38 is clocked directly by the high frequency oscillator through connection 39. A down-count end pulse automatically reloads the content of the accumulator 37 through a logic circuit 40. The frequency of this down-count end signal is expressed by:

$$\omega_{M/M} = 2 N \omega_R \quad (20)$$

The signal $\omega_{M/M}$ is passed through a divide-by-two counter 41 which produces a square wave of frequency $N\omega_R$.

One application of the proposed measurement technique is shown in the block diagram of FIG. 9. This circuit represents the basis for an instrument capable of measuring the power displacement factor in a single-phase, variable-frequency power system. This application assumes that a sinusoidal supply voltage is applied to the terminals of a linear or non-linear load 43. A linear load will be used for the performance analysis regarding the amplitude and the phase response of the SC tracking filter 44 and its sensitivity to deviation of parameters.

Figure 10:
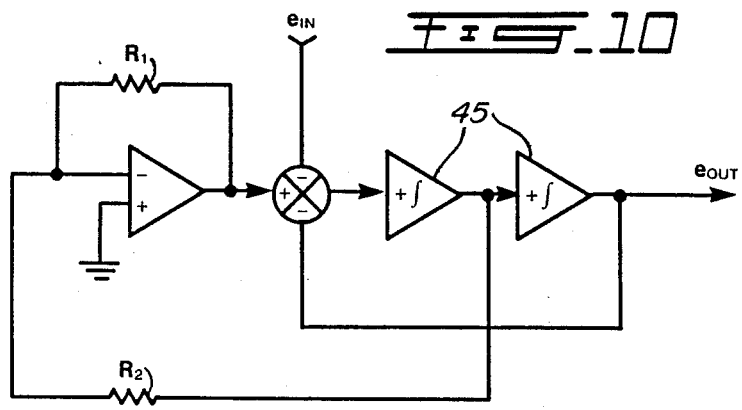
FIG. 10 is a schematic diagram illustrating the basic configuration for a second order low-pass filter using a national universal monolithic MF10.

The SCF 44 forms an 8th order Butterworth filter using two National universal monolithic MF10 45 as shown in FIG. 10. The basic filter building block for a 2nd order low-pass configuration (see FIG. 10), needs only two external resistors $R_1$ and $R_2$ to set the quality factor (Q) of the function's complex zero pairs. The low-pass gain is unity ($H_{oLP} = -1$) and the clock to cutoff frequency ratio is set to 100. The resistor values used in the design of the Butterworth filter are listed below. An 8th order configuration giving a 48 dB attenuation at twice the filter cutoff frequency was chosen as the design objective.

| Resistor values for the 8th order Butterworth filter using two National MF10 | | | |
|---|---|---|---|
| Stage # | Q | $R_1$ (kΩ) | $R_2$ (kΩ) |
| 1 | 0.51 | 22 | 11 |
| 2 | 0.60 | 22 | 13 |
| 3 | 0.90 | 22 | 20 |
| 4 | 2.56 | 22 | 56 |

The SCF clock signal ($\omega_h$) comes from a PLL 46 built around an RCA CD4046A; the overall configuration of the PLL is similar to the one in FIG. 7. The reference frequency derived form the sinusoidal line voltage is produced by a variable frequency generator 42. The zero-crossing circuit 47 assures proper voltage levels to the logic circuits.

The SCF 44 input receives the signal produced by a current shunt 48 mounted in one of the supply lines. The shunt signal is amplified, by an amplifier 49, to a proper level allowing a good signal-to-noise ratio with the operation of the MF10. The output 50 of the SCF passes through a conventional RC low-pass filter 51 which cleans the signal of any clock residues. During the test, the cutoff frequency of this filter is tuned at ten times the cutoff frequency of the SCF. Bearing in mind that the clock to cutoff frequency ratio of the SCF is 100, this calibration represents the best compromise between the phase shift introduced into the measured analog signal and the attenuation of the clock residues.

TEST RESULTS

Tests were conducted to verify the basic characteristics of the SCF 24, its phase behavior as a function of the tuning frequency and finally its phase and amplitude sensitivity to deviation in the values of the components.

As mentioned above, the SCF forms an 8th order Butterworth configuration. Using resistors with 5% tolerance to adjust the four stages of 2nd order basic filter, the characteristics obtained were very close to that of the ideal Butterworth filter.

Figure 11:
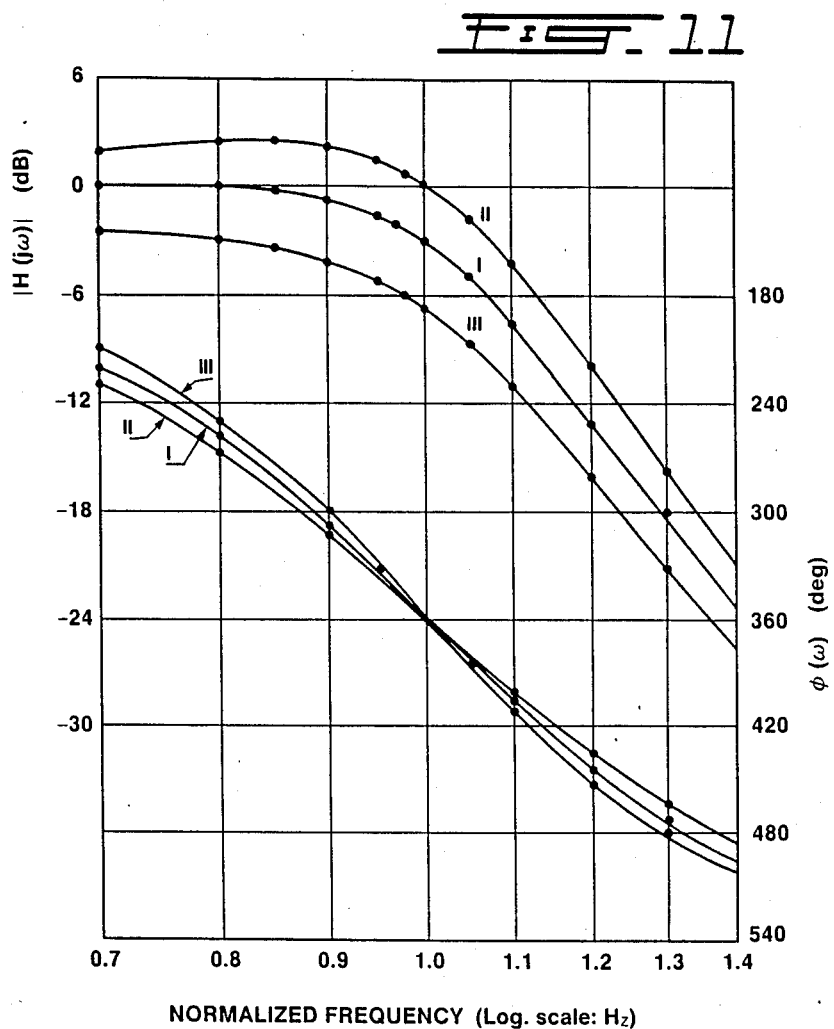
FIG. 11 is a characteristic representation of the experimental filter using an 8th order Butterworth filter.

FIG. 11 shows the experimental results near the cutoff frequency: the center curves for amplitude and phase shift depict test results corresponding to the nominal values of the resistors. At twice the cutoff frequency, the attenuation reaches 46 dB, or 2 dB less than the ideal value. Outer curves in FIG. 11 give the changed amplitude and phase shift when, through the variation of resistor values, the quality factor of all the 2nd order stages are shifted by +10% or −10%. One should note that, at the cutoff frequency, the phase shift is not affected by variation of Q. This means that the phase offset introduced by the SCF is almost independent of the absolute values of the external components. However, the gain of the SCF suffers from the variation of Q and an appreciable error can result in the amplitude measurement of the fundamental component, appearing at the output of the filter. Hence, it is advisable to modify one of the four stages in the SCF to allow some gain adjustment.

Figure 12:
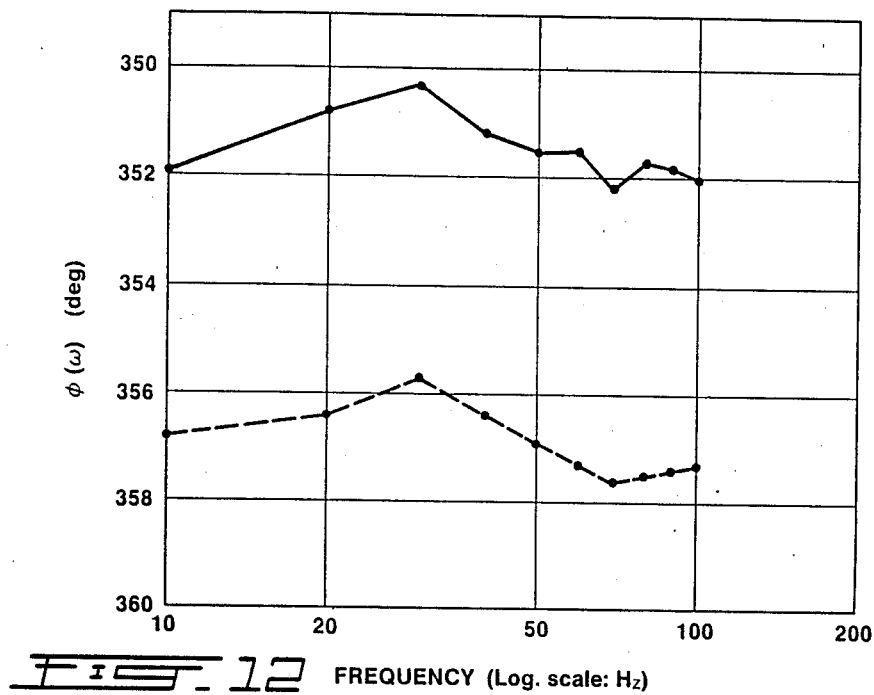
FIG. 12 is a frequency characteristic illustrating absolute phase offset as a function of input frequency.

FIG. 12 shows an important performance characteristic of the system of the present invention. As the input frequency changes form 10 Hz to 100 Hz, the absolute phase shift of the SCF 24 stays within a two-degree deviation. The test was performed using in-phase signals for both voltage and current, sinusoidal waveforms. The phase difference was measured by means of a calibrated zero-crossing detector 21. The good performance is attributed to the fact that the SCF is precisely tuned by the input voltage frequency via the PLL 29. In its locked condition, the PLL produces zero frequency error, allowing ultimate performance; the digital frequency multiplier has a non-zero frequency error which can increase the phase shift deviation at some frequencies. Also, one should note the additional phase shift introduced by the analog low-pass filter 31. The constant phase offset produced by this filter results from the fact that the filter was tuned at ten times the cutoff frequency of the SCF for each measured point. This was done mannually during the present test but a tunable analog filter, adjusted by the VCO 30 input voltage, can be designed.

Figure 13:
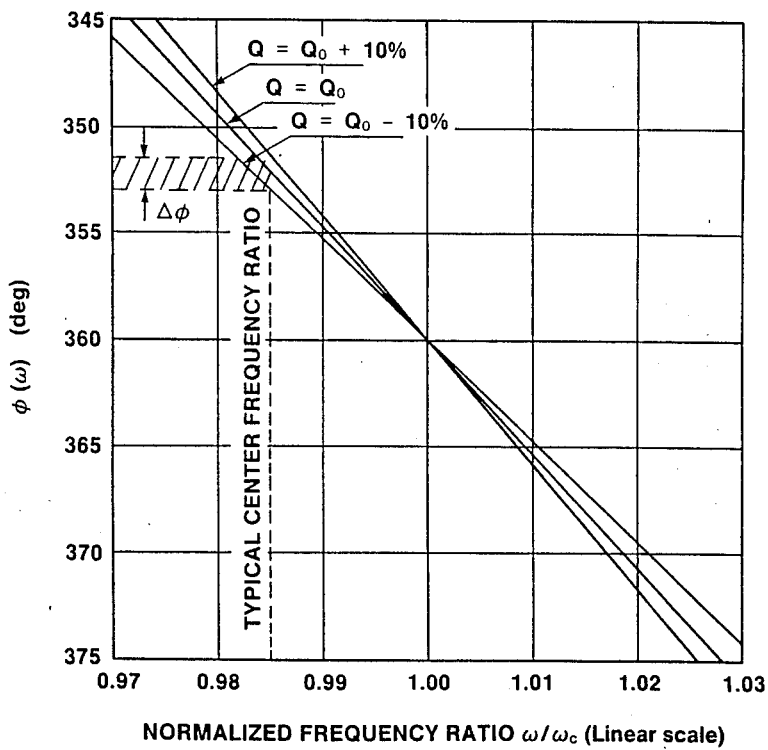
FIG. 13 is a characteristic curve illustrating the normalized frequency ratio thus illustrating the absolute phase offset as a function of center frequency ratio and quality factor.

The last test concerned the SCF phase sensitivity to Q's variation. As previously mentioned, the phase shift of the filter was unaffected, at the cutoff frequency, by variations of the Q values. In fact, operation of the MF10 introduces some phase variation; as shown in FIG. 13, a typical clock-to-cutoff frequency ration offset exists with a value of 0.985 or 1.5% off the ideal ratio. This results from the fabrication of the MF10 integrated circuit. Operation with such an offset, even relatively small, results in some sensitivity of the phase to variations of the Q values. In the present case, an 8th order filter is implemented; this results in a deviation of ±0.75° for a ±10% variation of the quality factor. In applications where a lower order filter should prove satisfactory, the same shift would yield less deviation because of the lower slope of the phase characteristic around cutoff frequency.

Tests have also been performed with a non-linear load. The performance of this system is also well demonstrated in an application where the power displacement factor of a single phase ac chopper, operating with a complex load, has to be measured. The chopper is made of two bidirectional MOSFET switches which are turned-on and off according to a scheme for nulling or at least minimizing the displacement of the fundamental component of the line current. The photographs of FIG. 14A and 14B show examples of the line current produced by the chopper supplying two different passive loads: in FIG. 14A, the load is slightly inductive ($\phi$load=30°) and the discontinuous line current looks like a part of a sinusoid, with the fundamental component in phase with the supply voltage; in FIG. 14B, the reactive nature of the load is increased ($\phi$load=60°) and by proper adjustment of turn-on and turn-off instants, the displacement angle can be set to zero. In such an application, the use of the harmonic analyzer based on SCF greatly eased the measurement procedure.

In summary, a new technique for measuring the amplitude as well as the phase angle of harmonics is provided with its principle of operation based on selective filtering of each harmonic, using a programmable switched-capacitor filter or analog filter. The method has some advantages: constant phase offset value of the tracking filter as a function of the operating frequency, zero-frequency error on the filter cutoff frequency, low phase sensitivity to variations of Q values and low cost implementation. A practical application of the technique has been demonstrated with the measurement of power displacement factor of a heavily distored line current, produced by the operation of a single-phase ac chopper.

The switched-capacitor filter harmonic analyzer of this invention has many applications, for example, it can be used for general measurement of reactive and distoration voltamperes in power converter applications; regulation involving power displacement factor or low order harmonics; accurate harmonic analyzer for network var compensation; quasi-analog fast Fourier transform; and selective waveform analysis or generation.

It is within the ambit of the present invention to cover any obvious modifications thereof provided such modifications fall within the scope of the appended claims.

I claim:

1. A harmonics analyzer system for simultaneously detecting the amplitude and phase angle of harmonics in a periodic signal, said system comprising: a tunable tracking filter connected to an input of said system for receiving said periodic signal having a frequency within a predictable range; conditioning circuit means connected to said input to tune said tracking filter to a selected harmonic in said periodic signal; and a programmable frequency multiplier circuit
   connected to said tracking filter for locking the clock frequency thereof to tune said tracking filter to said selected harmonic of said periodic signal to provide at its output an output signal having the amplitude and corresponding phase of the selected harmonic.

2. A harmonics analyzer system as claimed in claim 1 wherein there is further provided a low-pass analog filter connected to said output of said tracking filter to remove any clock frequency residue in said output signal.

3. A harmonics analyzer system as claimed in claim 2 wherein there is further provided a zero crossing detector connected to an output of said low-pass analog filter to produce a zero crossing mark on said output signal for comparison with a reference mark signal produced by a zero crossing detector in said conditioning circuit means.

4. A harmonics analyzer system as claimed in claim 2 wherein said conditioning circuit means comprises a sharp low-pass filter circuit connected to said input for receiving said periodic signal to extract therefrom the fundamental frequency to synchronize said frequency multiplier.

5. A harmonics analyzer system as claimed in claim 4 wherein said sharp low-pass filter is connected at its output to a zero crossing detector circuit which produces said pulses fed to said frequency multiplier circuit whereby to synchronize said frequency multiplier with a N×M ratio where N stands for the harmonic order, and produce at the output of said frequency multiplier a pulse train of N×M times the fundamental frequency of said periodic signal, and where M is the operating ratio of the tracking filter.

6. A harmonics analyzer system as claimed in claim 4 wherein said tunable tracking filter is a switched-capacitor filter.

7. A harmonics analyzer system as claimed in claim 6 wherein said switched-capacitor filter is a high order band-pass filter which has a selected clock-to-center frequency ratio of M, the center frequency of said switched-capacitor filter being tuned to N times the fundamental frequency of said periodic signal, N corresponding to the selected harmonic.

8. A harmonics analyzer system as claimed in claim 7 wherein said output signal at the output of said switch-capacitor filter resembles a sinusoid made of M discrete levels, resulting from the commutation action inside said switch-capacitor filter.

9. A harmoinics analyzer system as claimed in claim 1 wherein said frequency muliplier circuit is a phase-locked loop circuit having a voltage controlled oscillator fed by a phase detector through a low-pass filter, and a feedback loop consisting of a counter 1/N for locking the output frequency signal of said oscillator.

10. A harmonics analyzer system as claimed in claim 1 wherein said frequency multiplier circuit is a digital frequency multiplier.

11. A harmonics analyzer system as claimed in claim 2 wherein said low-pass analog filter is an adjustable filter to minimize the phase error of said selected harmonic.

12. A method for detecting the amplitude and phase angle of harmonics in a periodic signal comprising selectively filtering a harmonic using a tunable tracking filter which is locked on a seleted harmonic by means of a frequency muliplier which is synchronized by the fundamental frequency of said periodic signal.

13. A method as claimed in claim 12 further comprising the steps of:
 (i) feeding said periodic signalto said tunable tracking filter;
 (ii) producing clock pulses from said periodic signal and corresponding to the fundamental frequency of said periodic signal to synchronize said frequency multiplier; and
 (iii) selecting the desired harmonic in said frequency multiplier.

14. A method as claimed in claim 13 wherein said step (ii) comprises:
 (a) filtering in a low-pass filter said periodic signal to extract therefrom said fundamental frequency;
 (b) producing pulses in a zero crossing detector at the fundamental frequency of said signal fed by said low-pass filter; and
 (c) feeding said pulses to said programmable frequency muliplier.

15. A method as claimed in claim 14 wherein after step (iii) there is further provided the step of cleaning an output signal from said tracking filter through an analog low-pass filter to remove any clock residues in said output signal.

16. A method as claimed in claim 14 wherein said step (iii) comprises feedin said output signal at the output of said low-pass filter to a zero crossing detector to produce a zero crossing mark on said output signal for comparison with a reference mark signal corresponding to the fundamental frequency of said periodic signal.

* * * * *